(12) United States Patent
Kuroda et al.

(10) Patent No.: US 6,311,139 B1
(45) Date of Patent: Oct. 30, 2001

(54) METHOD FOR ESTIMATING YIELD OF INTEGRATED CIRCUIT DEVICE

(75) Inventors: Takao Kuroda, Kyoto; Hideki Ishida, Toyama, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/061,088

(22) Filed: Apr. 16, 1998

(30) Foreign Application Priority Data

Apr. 18, 1997 (JP) .................................................... 9-101355

(51) Int. Cl.[7] ..................................................... G06F 15/00
(52) U.S. Cl. ................................. 702/81; 438/14; 700/109
(58) Field of Search .................................. 702/81, 82, 83, 702/84; 438/5, 6, 14; 700/108, 109

(56) References Cited

U.S. PATENT DOCUMENTS

| | | |
|---|---|---|
| 5,438,527 | 8/1995 | Feldbaumer et al. . |
| 5,539,652 | 7/1996 | Tegethoff . |
| 5,754,432 * | 5/1998 | Komatsuzaki et al. ......... 364/468.17 |
| 5,773,315 * | 6/1998 | Jarvis ...................................... 438/14 |
| 5,777,901 * | 7/1998 | Beresin et al. ....................... 364/575 |
| 5,822,218 * | 10/1998 | Moosa et al. ......................... 364/488 |
| 5,991,699 * | 11/1999 | Kulkarni et al. ....................... 702/83 |
| 6,044,208 * | 3/2000 | Papadopoulou et al. ....... 395/500.05 |
| 6,066,179 * | 5/2000 | Allan ....................................... 716/4 |

FOREIGN PATENT DOCUMENTS 04167537    6/1992  (JP) .

OTHER PUBLICATIONS

Stapper, On Murphy's Yield Integral, IEEE, 1991.*
Berglund, A Unified Yield Model Incorporating Both Defect and Parametric Effects, IEEE, 8/96.*

Stapper et al., "Integrated Circuit Yield Management and Yield Analysis: Development and Implementation", IEEE 5/95.*

Baxter, "Monitoring and Predicting Defect Densities in a High Volume Manufacturing Facility for Increasing Yields", IEEE, 1995.*

Gaston et al., "Yield Prediction Using Calibrated Critical Area Modelling", IEEE, Mar. 1997.*

Stapper et al., "Yield Model for ASIC and Processor Chips", IEEE, 1993.*

Proc. of the IEEE Intl. Workshop on Defect and Fault Tolerance in VLSI Systems, Duvivier, et al.: "Approximation of Critical Area of ICs with Simple Parameters Extracted from the Layout" No. 1995, pp. 1–9.

Fukuhara H., et al., "Use of a Monte Carlo Wiring Yield Simulator to Optimize Design of Random Logic Circuits for Yield Enhancement", IEICE Transactions on Electronics, vol. E78–C, No. 7, Jul. 1995, pp. 852–857.

(List continued on next page.)

Primary Examiner—Patrick Assouad
(74) Attorney, Agent, or Firm—McDermott, Will & Emery

(57) ABSTRACT

The necessary information such as chip area A, number of elements, and defect density D is inputted to calculate element density TD and mean element density TDM. The inverse operation chip area A' is calculated from the estimation equation: Y=f(A) such as Stapper's equation showing the dependence of the yield on the defect density D and chip area A. Next, for various kinds of integrated circuit devices in a diffusion process, the functional relation g (TD/TDM) which is considered to be most correct is determined from the data of the relationship between the ratio (A'/A) and the ratio (TD/TDM), and from the relational expression g (TD/TDM), the correction factor K is calculated. Finally, the values of the correction factor K and the chip area A are substituted into Y=f(A×K) to calculate the expected yield Y.

9 Claims, 7 Drawing Sheets

OTHER PUBLICATIONS

Jitendra Khare, et al., "Sram–Based Extraction of Defect Characteristics" Mar. 22, 1994, Proceedings of the International Conference on Microelectronic Test Structures (ICMTS), San Diego, Mar. 22–25, 194 pp. 98–107, Institute of Electrical and Electronics Engineers.

Shahsavari, et al. "IC Yield Modeling and Statistical Circuit Simulation", Southern/94 Conf. Record, Mar., 1994, pp. 594–598.

James A. Cunningham: "The Use and Evaluation of Yield Models in Integrated Circuit Manufacturing", IEEE Trans, on Semiconductor Manufacturing, vol. 3, No. 2, May 1990, pp. 60–71.

Hacever, et al., "Parametric Yield Optimization For MOS Circuit Blocks", IEEE CAD 1988.

* cited by examiner

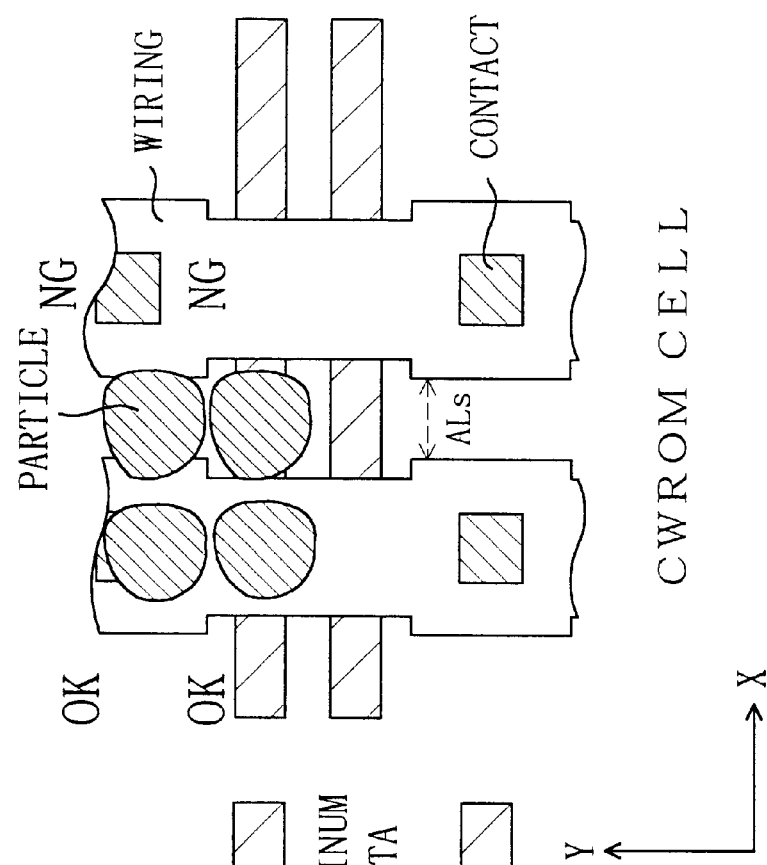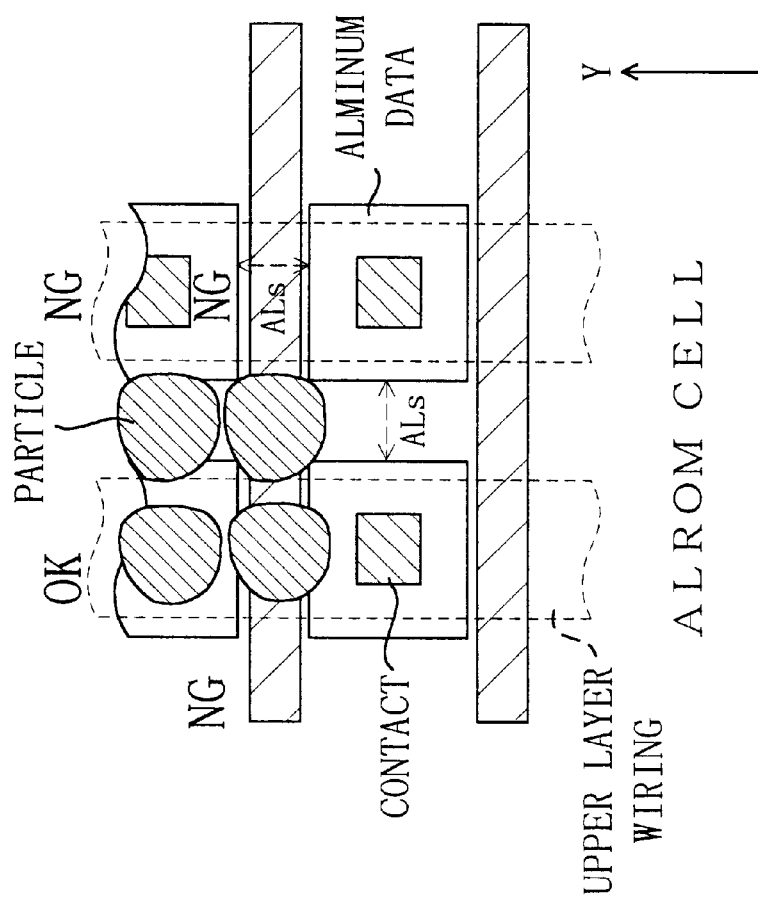

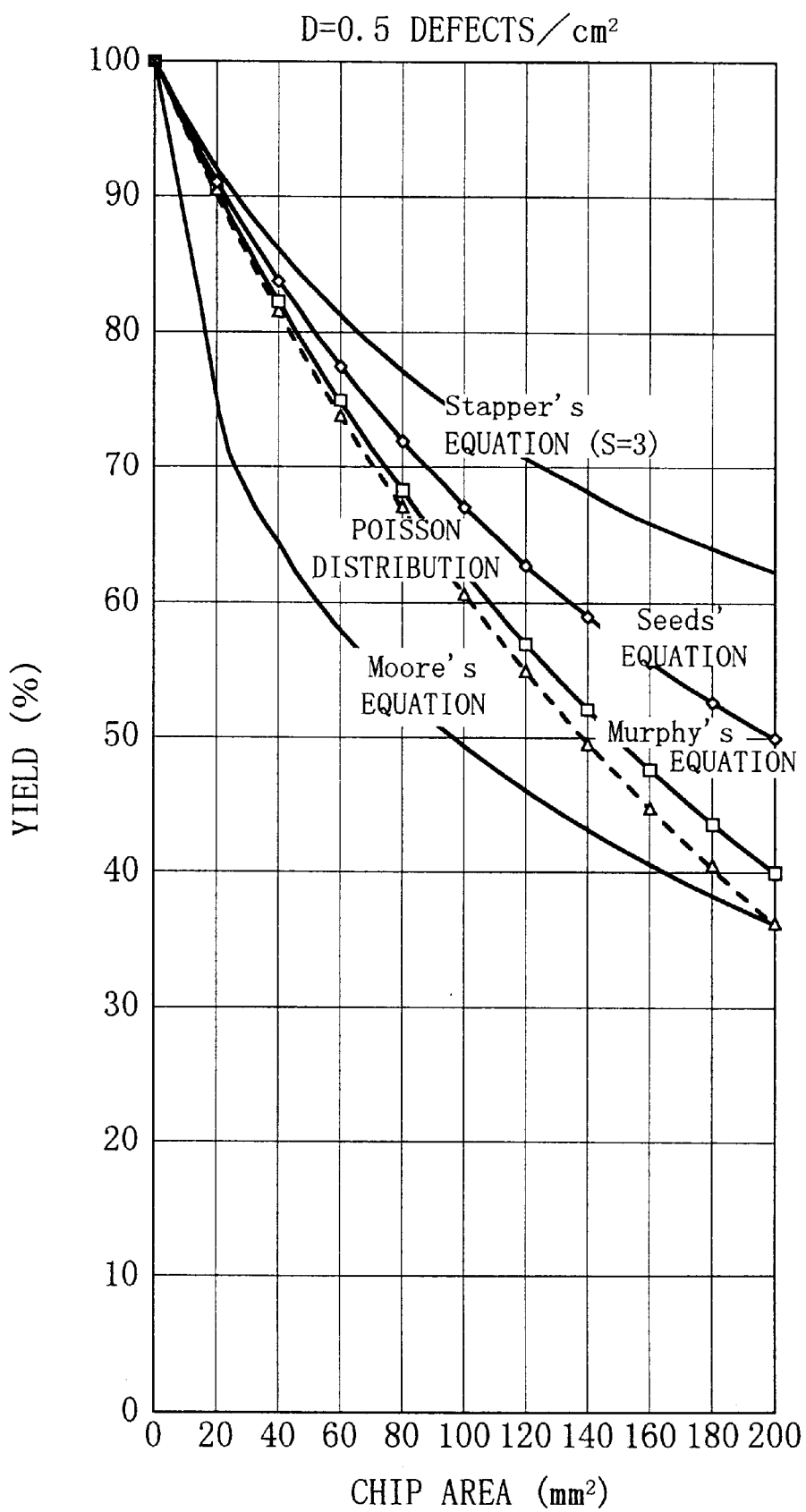

METHOD FOR ESTIMATING YIELD OF INTEGRATED CIRCUIT DEVICE

BACKGROUND OF THE INVENTION

The present invention relates to a method for estimating a yield In order to determine the number of non-defective devices to be obtained with respect to the number of charged wafers in manufacturing integrated circuit devices.

Generally, in devices for diversified small-quantity production in which new processes are often developed such as logic, microcomputer, and ASIC, if the number of produced non-defective devices does not reach the required number, it becomes a serious problem. This inevitably leads to the charging of a large number of wafers with a prescribed allowance, which has resulted in waste such as the production of a large number of non-defective devices exceeding the required number.

Therefore, on manufacturing integrated circuit devices from semiconductor wafers, it is an important problem to precisely estimate the number of non-defective devices to be finally obtained from the number of charged wafers, whereby the allowance of the number of wafers to be charged is reduced to implement a reduction in number of inutile wafers, and the savings in waste time and materials required for manufacturing thereof.

Thus, as a method for estimating the yield in the process for manufacturing integrated circuit devices, there has been a conventional method In which defect density in a diffusion process or the like Is employed. According to this method, the area of each chip In an integrated circuit, and the defect density in a diffusion fusion process or the like in which the integrated circuit devices are manufactured are used to calculate the expected yield of the integrated circuit devices. This method is effected, for example, by the procedure as follows:

If the chip area of an integrated circuit device is A (unit: $cm^2$), and the defect density in the diffusion process used in the manufacturing thereof is D (unit: defects/$cm^2$), the expected yield Y (unit: %)is calculated based on, for example, each equation as follows:

$Y=\{\exp(-A \times D)\} \times 100$  (Poisson's equation)

$Y=\{1/(1+A \times D)\} \times 100$  (Seeds' equation)

$Y=1/\{(1+A \times D \times S)^{1/S}\} \times 100$  (Stapper's equation)

(where S stands for allowable process variation)

$Y=[\{(1-\exp(-A \times D))/(A \times D)\}]^2 \times 100$  (Murphy's equation)

$Y=\exp\{-\sqrt{(A \times D)}\} \times 100$  (Moore's equation)

Here, the defect denotes a point defect such as pinhole in an oxide film, mask defect, contamination, or crystal defect.

The aforementioned Poisson's equation is calculated from the following procedure.

For the probability of defect generation occurring in a large number of manufacturing processes, the binomial distribution representing the probability P that x defects occur is calculated based on the assumption that events each in their respective process are mutually independent, and assuming that the number of processes is sufficiently large, the probability of defect generation is sufficiently small, and defects are uniformly distributed within the wafer surface, among wafers, and from batch to batch, the defect density D becomes a constant. Accordingly, the probability P can be expressed as the following Poisson distribution:

$P\{X=x\}=\{(A \times D)^x/x!\}\exp(-A \times D)$

Therefore, the yield Y can be expressed as the following Poisson's equation:

$Y=P\{X=0\}=\{\exp(-A \times D)\} \times 100$

Generally, however, it is said that the yield calculated according to the Poisson's equation tends to be smaller than the actual yield.

On the other hand, by supposing that the mean value A×D in the above Poisson distribution has a distribution, and that this distribution function is the Gamma function, the following Stapper's equation can be obtained:

$Y=1/\{(1+A \times D \times S)^{1/S}\} \times 100$

Assuming that S=1 in the above Stapper's equation yields the following Seeds' equation:

$Y=\{1/(1+A \times D)\} \times 100$

Therefore, this Seeds' equation is supposed to be included in the Stapper's equation in a broad sense. In the description below, the Seeds' equation is taken as the specific case of Stapper's equation, and hence it is decided that these equations are generically referred to as Stapper's equation.

Thus, in the conventional method, the expected yield has been estimated using each of the above estimation equations to determine the number of wafers to be charged based on the estimated result, thereby avoiding the consumption of inutile wafers, processing time and materials as much as possible.

However, when the yield is estimated using each of the above conventional equations, there has been a problem as follows: in the case where the chip area is small, or the number of masking is small, the estimated yield is relatively in fair agreement with the actual yield, whereas an increase in chip area causes a large deviation from the actual value. FIG. 7 is a characteristic curve showing the chip area dependence of the yield in each of the above equations. This indicates as follows: Poisson's equation, Stapper's equation (Seeds' equation), and Murphy's equation exhibit mutually close values of the expected yield, when the chip area is small. However, an increase in chip area causes the values to differ widely from one another. It is also predicted from the shape of the characteristic curve that an increase in chip area will cause an increase in discrepancy between an estimate and actual value.

As one example, comparison between estimates and actual values will be made below when yields are estimated using the above Stapper's equation, where it is assumed that S=1.

In the diffusion process where for defect density, D=0.63 (unit: defects/$cm^2$), the case where the following integrated circuit devices A to C of various kinds are manufactured will be considered.

Integrated circuit device A Chip area 0.44 (unit: $cm^2$)

Integrated circuit device B Chip area 0.79 (unit: $cm^2$)

Integrated circuit device C Chip area 0.30 (unit: $cm^2$)

For each of the above integrated circuit devices A to C, the above Stapper's equation is used to calculate the expected yield, leading to the following results:

Integrated circuit device A

Expected yield $Ya1=\{1/(1+0.44\times0.63)\}\times100=78.3\%$

Integrated circuit device B

Expected yield $Yb1=\{1/(1+0.79\times0.63)\}\times100=66.8\%$

Integrated circuit device C

Expected yield $Yc1=\{1/(1+0.30\times0.63)\}\times100=84.1\%$

FIG. 5 shows a chip area dependence curve y1 of the expected yield when calculated by the use of Stapper's equation which is one example of the conventional calculation method described above, and the yields Za1 to Zc1 when the above integrated circuit devices A to C were actually manufactured. As shown in the same diagram, the actual yields Za1 to Zc1 are not in agreement with the estimate curve y1 based on Stapper's equation, and vary vertically across the curve y1.

Therefore, in conventional estimation of yields, wafers cannot help being charged with considerably large allowance even if any of the estimation equations are used, and hence there has been a difficulty in saving wasteful wafers, time, and the like.

Especially, in integrated circuit devices with short product life, the number of required wafers must be predicted already in the development stage thereof. However, there have occurred a large number of integrated circuit devices largely deviating from the expected yield.

Thus, the inventors of the present invention have made attempts to clarify the cause resulting in the aforementioned discrepancy between the estimates and actual values as shown in FIG. 5, and to attain the solution thereof. As a result, they have found that the main cause thereof seems to be attributable to a difference in density between elements such as transistor mounted in an integrated circuit device.

SUMMARY OF THE INVENTION

It is an object of the present invention to provide a unified method for estimating a yield capable of calculating the expected yield of an integrated circuit device with high precision irrespective of the chip area by estimating the yield taking into account the density of elements mounted in the integrated circuit device.

In order to attain the forgoing object, the present invention is characterized in that as a method for estimating the yield of an integrated circuit device, the yield is estimated from the chip area corrected taking into account the element density in using estimation equations for predicting the yield from the chip area.

A method for estimating the yield of an integrated circuit device according to the present invention comprises: a step of inputting the number of elements in the integrated circuit device, the chip area of the Integrated circuit device, and the defect density In the manufacturing process of the integrated circuit device; a step of calculating the element density which is the number of the elements per unit area; a step of selecting an estimation equation representing the dependence of the expected yield on the defect density and the chip area; a step of correcting the chip area corresponding to the element density calculated in the step; and a step of substituting the corrected chip area and the defect density into the estimation equation to calculate the expected yield of the integrated circuit device.

According to this method, the chip area is corrected so that the corrected chip area increases with an increase in element density. That is, an increase in element density causes an increase in wiring density, which raises the probability of failure generation with respect to the same number of defects, In other words, reduces the yield. Accordingly, the chip area is thus corrected, which enables the estimation of the yield to be performed with high precision irrespective of the chip area.

A step of calculating the mean element density obtained based on the number of elements of an integrated circuit device manufactured In the manufacturing process is further comprised, and in the step of correcting the chip area, a correction factor is determined as a function of a value obtained by dividing the element density by the mean element density, and the correction factor can be multiplied by the inputted chip area to correct the chip area.

According to this method, a variable for determining a correction value can be set more correctly, which enables the establishment of a unified technique for the estimation of the yield.

In the step of correcting the chip area, the correction factor can be determined as the most probable function of a value obtained by dividing the element density by the mean element density, the most probable function being introduced from the data on various kinds of integrated circuit devices showing the correlation between a value obtained by dividing an inverse operation chip area obtainable by performing the inverse operation from the estimation function to be used by the chip area, and a value obtained by dividing the element density by the mean element density.

According to this method, the yield can be estimated based on the data in a process for manufacturing actual integrated circuit devices with precision.

When different kinds of circuits are mounted in the integrated circuit device, in the step of calculating the element density, it is preferable that weighting is performed corresponding to the kind of the circuits to calculate the element density.

According to this method, it becomes possible to perform the estimation of the yield that reflects a difference in wiring density varying with not only the element density but also the kind of circuits to enhance the precision of the estimation of the yield.

When a logic circuit region and a memory cell region are provided in the integrated circuit device, in the step of calculating the element density, it is preferable that the number of elements in the memory cell region is multiplied by a weighting factor larger than 0 and smaller than 1 to calculate the element density.

According to this method, it becomes possible to perform the estimation of the yield reflecting the fact that the amount of wiring per transistor is small in a transistor in the memory cell region.

When a digital circuit region and an analog circuit region are provided in the integrated circuit device, it is preferable that the number of elements in the analog circuit region is weighted by larger than 1 to calculate the element density.

According to this method, it becomes possible to perform the estimation of the yield reflecting the fact that the amount of wiring per transistor is large in a transistor in the analog circuit region.

When a plurality of kinds of elements are mounted of which the probabilities of failures given by the same number of defects differ from one another depending on the condition where a wiring layer interconnecting diffusion layers of each element in the integrated circuit device is formed, in the step of calculating the element density, it is preferable that the number of the elements is weighted corresponding to the probability of failures given by defects at the part interconnecting each of the elements and a wire to calculate the element density.

According to this method, even when the probability of failures resulting from the same number of defects varies with a difference in wiring construction, for example, as in an ALROM cell and CWROM cell, the yield can be estimated with high precision in consideration for this fact. Here, the ALROM refers to ROM of the type using aluminum wiring for the formation of data to be stored, while the CWROM refers to ROM of the type using the presence and absence of a viahole (contact) for the formation of data to be stored.

The estimation of the defect density can be performed based on the data showing the relationship between the chip area-the defect density, and the actual yield for various kinds of integrated circuit devices in the manufacturing process of the integrated circuit device.

According to this method, it becomes possible to grasp the defect density with precision based on the actual yield often influenced by the conditions characteristic of each production line and various kinds of integrated circuit devices while avoiding the difficulty in calculating the actual yield by directly observing the defects.

As the chip area, it is preferable that the one corrected so as to increase the chip area with an increase in element density corresponding to the element density in each integrated circuit device is used.

According to this method, a leap upward in the precision of estimation of the defect density is implemented, resulting in still higher precision of final estimation of yields.

BRIEF DESCRIPTION OF THE DRAWINGS

FIGS. 4(a) and 4(b) are plan views for illustrating the difference in wiring construction between the ALROM cell and CWROM cell of an integrated circuit device in accordance with the second embodiment;

FIG. 7 is a characteristic diagram showing an estimation curve describing each model estimating the yield from the chip area.

DETAILED DESCRIPTION OF THE INVENTION (First embodiment)

Below, a description will be given to a first embodiment of the present invention with reference to FIGS. 1 to 3. In this embodiment, for the 3 kinds of integrated circuit devices A to C illustrated in the above background of the invention, each yield is estimated by the use of Stapper's equation taking into account the transistor density. In this embodiment, however, for simplifying the description, the case will be illustrated where the Integrated circuit devices A to C are integrated circuit devices mounted with only random logic including no memory.

Figure 1:
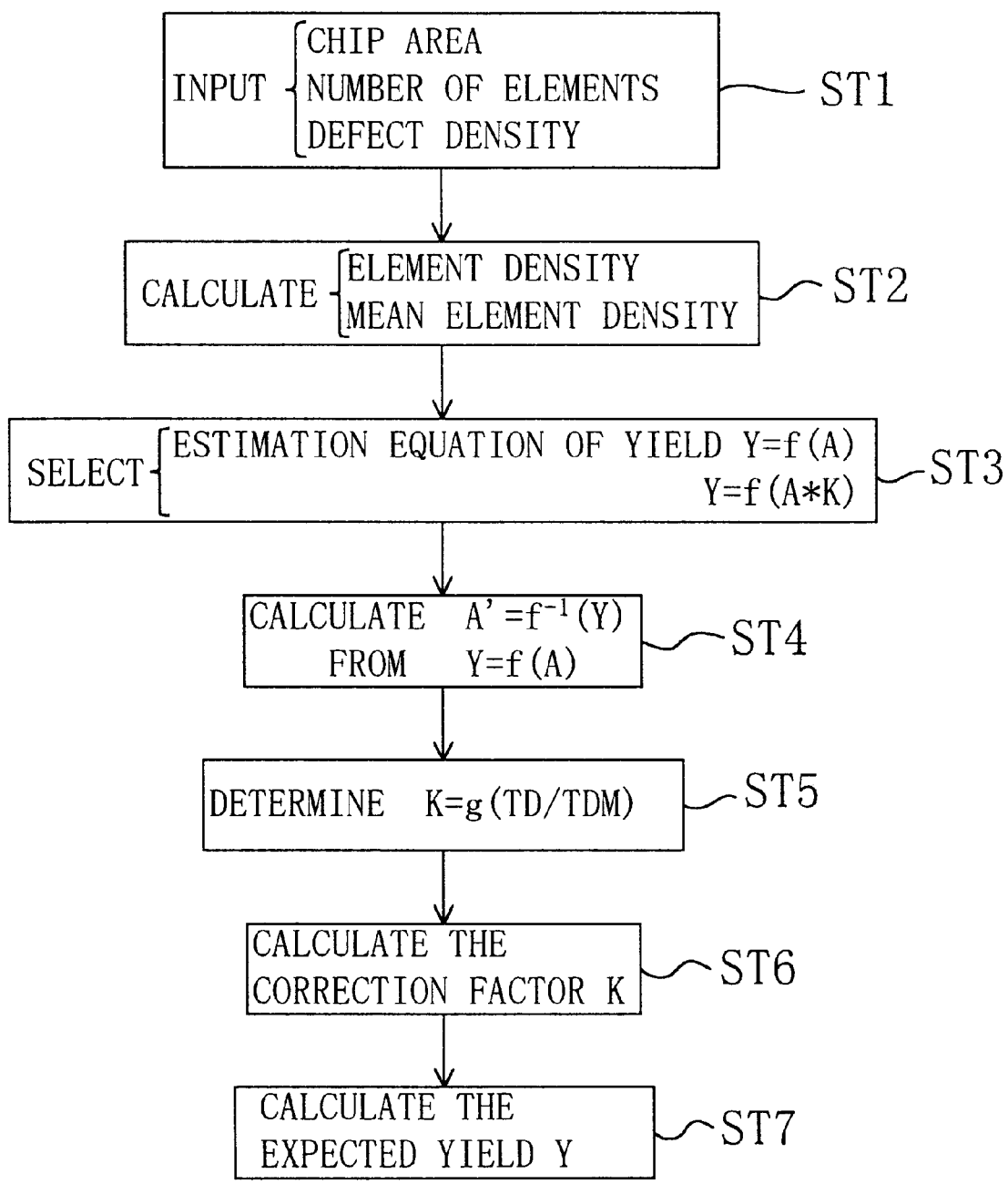
FIG. 1 is a flowchart showing the procedure of estimating the yield of an integrated circuit device in accordance with each embodiment.

FIG. 1 is a flowchart illustrating the procedure of the method for estimating the yield in accordance with this embodiment.

First, in a step ST1, each chip area, number of transistors, and defect density of the integrated circuit devices A to C are inputted. In this step, the number of transistors of each integrated circuit device is as follows:

Integrated circuit device A

Chip area: 0.44 cm$^2$

Number of transistors: 140,840 transistors

Integrated circuit device B

Chip area: 0.79 cm$^2$

Number of transistors: 739,851 transistors

Integrated circuit device C

Chip area: 0.30 cm$^2$

Number of transistors: 154,387 transistors

The integrated circuit device A is the one in which the number of transistors per unit area is small (the transistor density is small), the integrated circuit device B is the one in which the number of transistors per unit area is large, and the integrated circuit device C is the one in which the number of transistors per unit area is a mean value.

Figure 6:
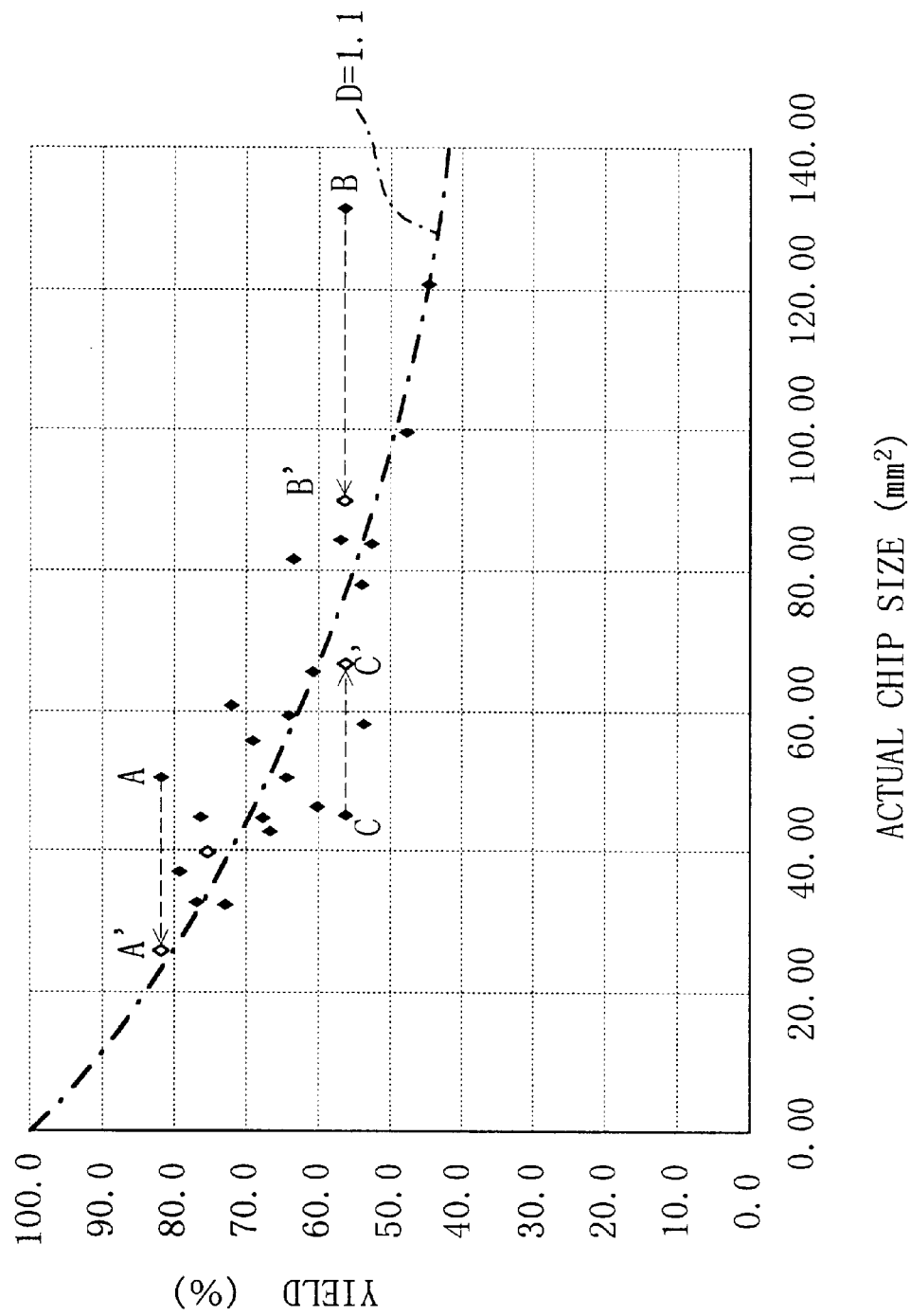
FIG. 6 is a diagram for illustrating the method for determining the defect density from the data showing the correlation between the chip area and yield.

The defect density D in the diffusion process in the manufacturing process of the above integrated circuit devices A to C can be directly determined by, for example, observing the semiconductor substrate surface to detect the number of crystal defects, the number of particles, or the like. However, it is also possible to empirically determine the defect density D considering that the defects actually leading to the device failures do not necessarily conform to the actually detected defects, and that one defect is counted repeatedly in a large number of processes. For example, making use of the fact that in a product line to be used, the chip area dependence of the yield expressed by Stapper's equation, and the like varies taking the defect density D as a parameter, the defect density D can be determined with relative precision by the method of least squares, or the like from the data of the chip area and yield obtained in an experiment. For example, when there exist the data shown in FIG. 6, it can be determined as D=1.1. As stated below, also in determining the defect density D, it is preferable that the chip area is corrected with the transistor density. Referring also to FIG. 6, a large number of factors such as error in design and difference in the number of processes in addition to the aforementioned difference in transistor density exert an influence upon the fact that in each integrated circuit device, its respective dot representing actual data is largely deviated from the estimation curve.

It is assumed in this embodiment that the defect density D is uniform and 0.63 (defects/cm$^2$) in the same manner as described above.

Next, in a step ST2, the transistor density TD (unit: transistors/cm$^2$) which is the number of transistors per unit area of the integrated circuit device is calculated from the following equation:

$$TD = \text{the number of transistors/chip area}$$

The mean transistor density TDM (unit: transistors/cm$^2$) which is the mean value of the transistor density TD of various kinds of integrated circuit devices actually being manufactured is calculated in the same manner. It is assumed in this embodiment that the mean transistor density TDM of the aforementioned various kinds of integrated circuit devices actually being manufactured in the diffusion process is calculated to be 5400 (transistors/cm$^2$).

Next, in a step ST3, the estimation equation to be used, Y=f(A) is chosen. In this embodiment, the following equation (1), which is Stapper's equation:

$$Y = \{1/(1+A \times D)\} \times 100 \tag{1}$$

is used.

Here, the primary advantage of the method for estimating the yield according to the present Invention Is that the chip area A in the above equation (1) is corrected taking into account the transistor density in an integrated circuit device. For example, as the transistor density increases, the wiring density also increases, and hence the probability of failure generation relative to the same defect density is raised. Therefore, in this embodiment, assuming that the correction factor of the chip area A is K, the above equation (1) is made into the form of the following equation (2):

$$Y = \{1/(1+A \times K \times D)\} \times 100 \tag{2}$$

The value K in the equation (2) is a factor for correcting the chip area A so as to reflecting the number of transistors for every actual integrated circuit device. In order to determine the correction factor K, the following process is conducted.

First, from the above equation (1), A=f$^{-1}$(Y) which is the inverse function thereof is calculated in a step ST4. In this embodiment, the Inverse operation is conducted by the use of Stapper's equation from the actual yield Y (unit: %) of the diffusion process and the defect density D In the diffusion process (unit: defects/cm$^2$) of each integrated circuit device actually being manufactured. That is, the inverse operation chip area A' (unit: cm$^2$) is expressed as the following equation (3):

$$A' = (100/Y - 1)/D \tag{3}$$

The defect density D is substituted into the equation (3). Considering that the expected yield Y in the equation (3) will be finally corrected taking into account the transistor density TD, the inverse operation chip area A' thus calculated can be considered to be the corrected chip area, and hence it may be construed that K=A'/A.

It is assumed in the present invention that the correction factor K is a function which varies depending upon the transistor density TD. That is, the value K is considered to be a function of the ratio of transistor density TD to mean transistor density TDM (TD/TDM), and in order to determine the following equation (4):

$$K = A'/A = g(TD/TDM) \tag{4}$$

the following process will be conducted.

Figure 3:
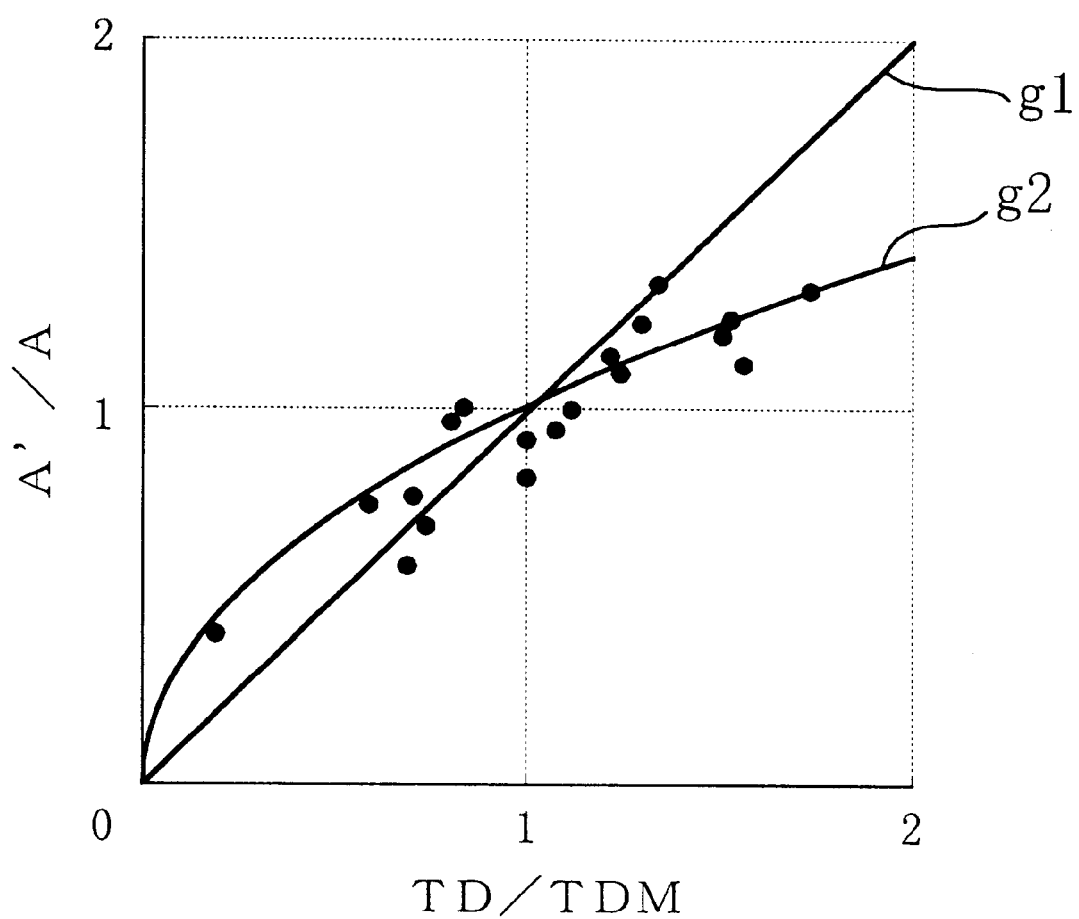
FIG. 3 is a diagram showing the correlation between A'/A and TD/TDM of various kinds of integrated circuit devices used in the first embodiment.

FIG. 3 is a diagram plotting the relationship between the ratio of the inverse operation chip area A' to actual chip area A (A'/A) and the ratio of the transistor density TD of an integrated circuit device to mean transistor density TDM which is a mean value of TD of various kinds of integrated circuit devices actually being manufactured in the diffusion process for manufacturing the above integrated circuit device (TD/TDM). As shown in FIG. 3, between the ratio (A'/A) and the ratio (TD/TDM), there is a tendency roughly as follows:

(1) When the transistor density TD is larger than the mean transistor density TDM:

In this case, the positional relationship of one transistor to another becomes close, and hence the mean wiring length per transistor exerting an influence upon the yield decreases, resulting in (A'/A)<(TD/TDM). In other words, referring to FIG. 3, there exist a large number of dots in the region lower than the straight line g1 when A'/A=TD/TDM. The larger the transistor density TD becomes than the mean transistor density TDM, the larger a difference between the left-hand side and right-hand side becomes.

(2) When the transistor density TD is smaller than the mean transistor density TDM:

In this case, the mean wiring length per transistor exerting an influence upon the yield increases, resulting in (A'/A)>(TD/TDM). The smaller the transistor density TD becomes than the mean transistor density TDM, the larger a difference between the left-hand side and right-hand side of the above inequality becomes. Inotherwords, referring to FIG. 3, there exist a large number of dots in the region upper than the straight line g1 when A'/A=TD/TDM.

In actually designed integrated circuit devices, the value of the ratio (TD/TDM) falls in the range of about 0.3 to 4, and hence such functional relation as to be adapted for the data in this domain may be determined.

Then, the functional relation K=g (TD/TDM) is determined so as to satisfy the aforementioned relation and to be adapted for the data in FIG. 3. It is herein assumed that judging from the condition in which each dot is distributed in FIG. 3, the curve g2 shown in the same diagram denotes a function most close to the data. In other words, assuming that the correction factor K is a function of square root of the ratio (TD/TDM), it is approximated with the following equation (5):

$$K = SQRT(TD/TDM) \tag{5}$$

This proved to be approximation sufficient for practical use.

Next, in a step ST6, the correction factor K will be calculated from the equation (5). For example, the values K of the above integrated circuit devices A to C are calculated as follows:

Integrated circuit device A $$Ka = SQRT(TD/TDM) = SQRT\{(140,840/0.44)/5400\} = 0.770$$

Integrated circuit device B $$Kb = SQRT(TD/TDM) = SQRT\{(739,851/0.79)/5400\} = 1.317$$

Integrated circuit device C $$Kc = SQRT(TD/TDM) = SQRT\{(154,387/0.30)/5400\} = 0.976$$

Next, in a step ST7, by substituting the above Ka, Kb, and Kc into the above equation (2), the expected yield is calculated. For example, the expected yield of each of the above integrated circuit devices A to C is calculated as follows:

Integrated circuit device A $$Ya2 = \{1/(1+0.44 \times 0.770 \times 0.63)\} \times 100 = 82.4\%$$

Integrated circuit device B $$Yb2 = \{1/(1+0.79 \times 1.317 \times 0.63)\} \times 100 = 60.4\%$$

Integrated circuit device C $$Yc2 = \{1/(1+0.30 \times 0.976 \times 0.63)\} \times 100 = 84.4\%$$

Figure 2:
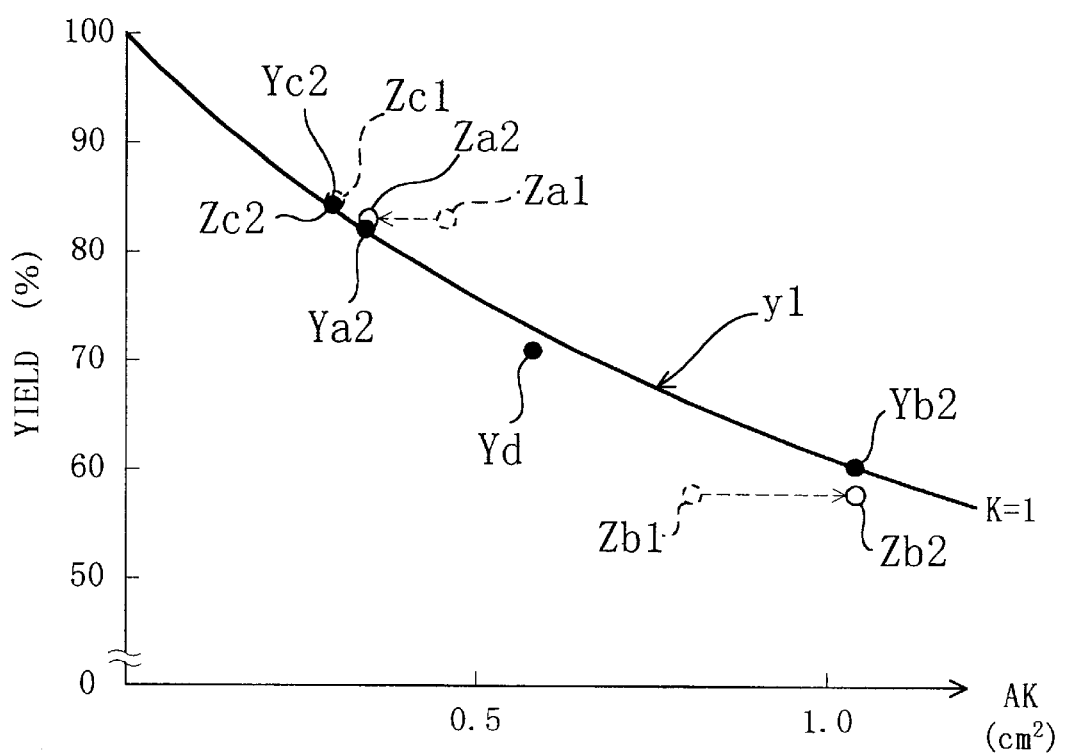
FIG. 2 is a diagram showing the expected yields according to the first embodiment and the results of actual yields by comparison thereof.

FIG. 2 shows the relationship between the corrected chip area A×K and the yield Y. In the diagram, the dots Ya2 to Yc2 denoted by a solid line shows the aforementioned calculated results. Also, the dots Za1 to Zc1 denoted by a dotted line are the dots each representing the actual yield for the chip area A which is not corrected, while the dots Za2 to Zc2 denoted by a solid line are the dots each representing the actual yield for the corrected chip area A×K. As shown in the same diagram, when comparison is made by the use of the corrected chip area A×K, the actual yield and expected yield are in fair agreement with each other for the integrated circuit devices A to C.

Figure 5:
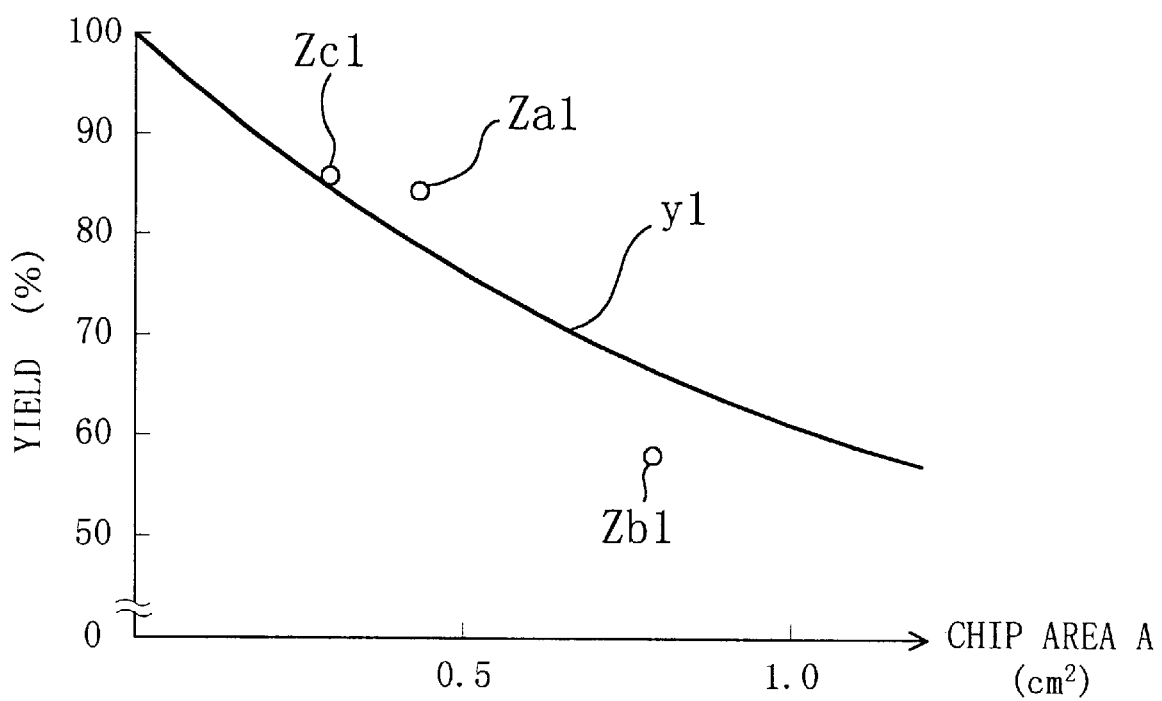
FIG. 5 is a diagram showing the expected yields according to conventional Stapper's equation and the results of actual yields.

The curve y1 is also a curve calculated from the equation (1) when it is assumed that the correction factor K=1, that is, Stapper's equation, and hence the same curve as that shown in FIG. 5. As shown in FIG. 2, the expected yields Ya2 to Yc2 are on the curve y1 on the whole. In other words, it is indicated that the correction of the chip area enables the estimation of the yield by the use of basic equations such as Stapper's equation to be performed with precision.

As described above, according to this embodiment, the expected yield can be calculated from the estimation equation corrected taking into account the transistor density (in this embodiment, Stapper's equation), resulting in the yield being substantially in agreement with the actual value. This can provide an extremely high precision of estimation.

That is, the higher the transistor density is, the higher the wiring density becomes. Accordingly, even if there occurs the same number of defects in unit area, the probability that an integrated circuit device fails due to the defects also increases. Thus, by correcting the chip area so as to be seemingly larger than the actual value A for the one having a high transistor density TD, the precision of estimation can be enhanced employing the estimation equations.

However, in that case, the correction factor K is not necessarily required to be represented as a function of the ratio (TD/TDM) as in this embodiment, and the correction factor K may be determined as a function of the transistor density TD from experiments, or the like.

As in this embodiment, the mean transistor density TDM in various kinds of integrated circuit devices can be obtained to determine the correction factor K corresponding to the ratio (TD/TDM), which enables the variable for determining the correction factor K to be set more correctly. As a result, it becomes possible to establish a unified technique for determining the value K.

Further, the inverse operation chip area A' can be calculated to determine the functional relation between the ratio (TD/TDM) and the correction factor K from the correlation between the ratio (TD/TDM) and the ratio (A'/A) in various kinds of integrated circuit devices, resulting in a functional relation g which seems to be more correct based on the actual data.

Also in determining the defect density D shown in FIG. 6, it is preferable that the chip area is corrected with the transistor density TD employing the technique according to this embodiment. For example, the dots A, B, and C shown in FIG. 6, each of which is the chip area prior to correction, are corrected with the ratio of the transistor density TD to mean transistor density TDM, which shifts the dots each to its respective point close to the estimation curve as the dots A', B', and C' shown in the same diagram, respectively. Accordingly, for example, in determining the defect density D which is a parameter by the use of the method of least squares, it becomes possible to conduct more correct estimation.

(Second embodiment)

Next, a description will be given to the second embodiment on the expected yield of an integrated circuit device including memory. In this embodiment, the method for estimating the yield of an integrated circuit device D including ROM as memory will be explained.

The data on the integrated circuit device D to be used in this embodiment is as follows:

Chip Area: $A = 0.46 \text{ cm}^2$

Number of transistors:

Assuming that the number of transistors in the ROM part in the integrated circuit device is TrROM (unit: transistors):

TrROM=524,288 transistors

Assuming that the number of transistors outside the ROM part in the integrated circuit device is TrLOG (unit: transistors):

TrLOG=130,000 transistors

Defect density in the diffusion process for manufacturing the integrated circuit device D:

$D = 0.63 \text{ (defects/cm}^2)$

Mean value of TD of various kinds of integrated circuit devices being actually manufactured in the above diffusion process:

$TDM = 5400 \text{ (defects/cm}^2)$

It is the same also in this embodiment to estimate the yield in accordance with each of the steps ST1 to ST7 of the flowchart of FIG. 1. However, in this embodiment, considering the fact that a short in wiring and disconnection of wire caused by the presence of particles account for most of the failures as defect affecting the yield, the following correction is conducted.

In the step ST1, TrROM and TrLOG are inputted as the number of transistors, and then in the step ST2, the transistor density TD is calculated based on the following concept.

Generally, there exists the following difference in number of wires per transistor (where wires for connection to power is excluded) between a transistor in a random logic circuit and a transistor in ROM.

| Random logic | 2 wires (Drain and Gate) |
| ROM | 1 wire (Drain) |

Then, since there is a difference in number of wires per transistor, even if there occurs the same defect density in the wiring part, the effect of the defect density on the yield of the integrated circuit device becomes different. In consideration for this fact, the number of transistors in the ROM part is corrected using the ratio of the above number of wires in calculating the transistor density TD. That is, the transistor density TD is calculated by the following equation:

$$TD=(Tr_{LOG}+0.5\times Tr_{ROM})/A$$

In other words, weighting is performed corresponding to the kind of the elements including a transistor.

Then, in accordance with each of the steps ST1 to ST7 of the flowchart of FIG. 1, the calculation of the correction factor K, and the calculation of the expected yield were performed to obtain the following values:

$$TD=(130.000+0.5\times524,288)/0.46=8,525$$

$$K=SQRT\ (8525/5400)=1.256$$

$$Yd=\{1/(1+0.46\times1.256\times0.63\}\times100=73.3(\%)$$

The dot Yd in FIG. 2 is the expected yield consequently obtained. As shown in the same diagram, the dot Yd exhibits a value extremely close to the curve y1.

According to the method for estimating the yield of this embodiment, it is noted that there is a difference in number of wires per transistor between a memory transistor and a logic transistor, and the yield is estimated using the transistor density TD weighted in accordance therewith. This enables the performance of the estimation of yields with high precision also for integrated circuit devices including memory and logic.

However, the value of weighting itself is not limited to the values of weighting in this embodiment.

(Third embodiment)

Next, the third embodiment will be described. In this embodiment, consideration will be given not only to a difference in number of wires of a transistor as illustrated above in the second embodiment, but also to a difference in probability of failure generation due to the structure of wiring.

FIGS. 4(a) and (b) are plan views for illustrating a difference in probability of failure generation between an ALROM cell and a CWROM cell. Here, the ALROM refers to ROM of the form using aluminum wires for forming data to be stored, while the CWROM refers to ROM of the form using the presence or absence of a viahole (contact) for forming data to be stored. On the assumption that there exist the same 4 particles in the ALROM cell and CWROM cell, short circuits occur at 3 points in the ALROM cell shown in FIG. 4(a), while short circuits occur only at 2 points in the CWROM cell. This is attributed to the fact as follows: the methods for forming wiring are different with each other for the two cells, and hence a short circuit between Als becomes a problem only in the x direction in the CWROM cell, while in the ALROM cell, aluminum data in contacts are isolated from one another, and hence a short circuit becomes a problem both in the x and y directions.

Then, in this embodiment, assuming that the number of ALROM cells is TR$_{ALROM}$, and that the number of CWROM cells is TR$_{CWROM}$ in a memory cell region, the transistor density TD (substantially wiring density) is calculated according to the following equation:

$$TD=\{Tr_{LOG}+0.5\times(TR_{ALROM}+TR_{CWROM}\times0.55)\}/A$$

It is the same as illustrated in the above first and second embodiments to conduct processing in accordance with the flowchart of FIG. 1.

According to this embodiment, it is noted that the probability of failures with respect to the same number of defects differs depending on the method for forming wiring interconnecting diffusion layers of each transistor, based on which the number of elements is weighted to calculate the transistor density TD. This enables the estimation of yields to be performed with higher precision.

However, the value of weighting itself is not limited to the value of weighting in this embodiment.

(The other embodiments)

In the above second and third embodiments, a description was given on the assumption that only digital circuits are placed in both cases. However, also in the case where digital circuits and analog circuits having bipolar transistors or the like are placed, the number of transistors can be weighted taking into account the number of wires per transistor, and the like. In this case, in consideration for the size of transistors and the amount of wires, for example, if the number of transistors in the analog circuit is Tr$_{ANA}$, for the Tr$_{ANA}$, about four-fold weighting can be performed to yield the transistor density TD as the following equation:

$$TD=(Tr_{LOG}+4\times Tr_{ANA})/A$$

In each of the above embodiments, yields were estimated using Stapper's equation where allowable process variation S is 1 (in a narrow sense, Seeds' equation). However, the present invention is not limited to such embodiments, and in Stapper's equation where allowable process variation S is not 1:

$$Y=1/\{(1+A\times D\times S)^{1/S}\}\times100$$

A×K can be used in place of the chip area A.

Further, it Is needless to say that Poisson's equation, Murphy's equation, Moore's equation, or the other estimation equations can be used.

All of the elements in each of the above embodiments are transistors. However, the elements according to the present invention are not limited to the embodiments, and hence the present invention can be also adaptable for active elements other than transistors such as diode, and passive elements such as resistance element and capacitance element.

We claim:

1. A method for estimating the yield of an integrated circuit device comprising:

a step of inputting the number of elements in the integrated circuit device, the chip area of said integrated circuit device, and the defect density in the manufacturing process of said integrated circuit device;

a step of calculating the element density which is the number of said elements per unit area;

a step of selecting an estimation equation representing the dependence of the expected yield on the defect density and the chip area;

a step of correcting the chip area corresponding to said element density calculated in said step; and a step of substituting said corrected chip area and said defect density into said estimation equation to calculate the expected yield of said integrated circuit device.

2. A method for estimating the yield of an integrated circuit device comprising:

a step of inputting the number of elements in the integrated circuit device, the chip area of said integrated circuit device, and the defect density in the manufacturing process of said integrated circuit device;

a step of calculating the element density which is the number of said elements per unit area;

a step of selecting an estimation equation representing the dependence of the expected yield on the defect density and the chip area;

a step of correcting the chip area corresponding to said element density calculated in said step;

a step of substituting said corrected chip area and said defect density into said estimation equation to calculate the expected yield of said integrated circuit device, and a step of calculating the mean element density obtained based on the number of elements of an integrated circuit device manufactured in said manufacturing process, wherein in said step of correcting the chip area, a correction factor is determined as a function of a value obtained by dividing said element density by said mean element density, and said correction factor is multiplied by the inputted chip area to correct the chip area.

3. A method for estimating the yield of an integrated circuit device according to claim 2, wherein in said step of correcting the chip area, the correction factor is determined as the most probable function of a value obtained by dividing the element density by the mean element density, said most probable function being introduced from the data on various kinds of integrated circuit devices showing the correlation between a value obtained by dividing an inverse operation chip area obtainable by performing the inverse operation from said estimation function to be used by the chip area, and a value obtained by dividing the element density by the mean element density.

4. A method for estimating the yield of an integrated circuit device comprising:

a step of inputting the number of elements in the integrated circuit device, the chip area of said integrated circuit device, and the defect density in the manufacturing process of said integrated circuit device;

a step of calculating the element density which is the number of said elements per unit area;

a step of selecting an estimation equation representing the dependence of the expected yield on the defect density and the chip area;

a step of correcting the chip area corresponding to said element density calculated in said step; and a step of substituting said corrected chip area and said defect density into said estimation equation to calculate the expected yield of said integrated circuit device, wherein in said integrated circuit device, different kinds of circuits are mounted, and in said step of calculating the element density, weighting is performed corresponding to the kind of said circuits to calculate the element density.

5. A method for estimating the yield of an integrated circuit device according to claim 4, wherein in said integrated circuit device, a logic circuit region and a memory cell region are provided, and in said step of calculating the element density, the number of elements in said memory cell region is multiplied by a weighting factor larger than 0 and smaller than 1 to calculate the element density.

6. A method for estimating the yield of an integrated circuit device according to claim 4, wherein in said integrated circuit device, a digital circuit region and an analog circuit region are provided, and the number of elements in said analog circuit region is weighted by larger than 1 to calculate the element density.

7. A method for estimating the yield of an integrated circuit device comprising:

a step of inputting the number of elements in the integrated circuit device, the chip area of said integrated circuit device, and the defect density in the manufacturing process of said integrated circuit device;

a step of calculating the element density which is the number of said elements per unit area;

a step of selecting an estimation equation representing the dependence of the expected yield on the defect density and the chip area;

a step of correcting the chip area corresponding to said element density calculated in said step; and a step of substituting said corrected chip area and said defect density into said estimation equation to calculate the expected yield of said integrated circuit device, wherein a plurality of kinds of elements are mounted of which the probabilities of failures given by the same number of defects differ from one another depending on the condition where a wiring layer interconnecting diffusion layers of each element in said integrated circuit device is formed, and in said step of calculating the element density, the number of said elements is weighted corresponding to the probability of failures given by defects at the part interconnecting each of said elements and a wire to calculate the element density.

8. A method for estimating the yield of an integrated circuit device according to claim 1, wherein an estimation of said defect density is performed based on the data showing the relationship between the chip area and the defect density, and the actual yield for various kinds of integrated circuit devices in the manufacturing process of said integrated circuit device.

9. A method for estimating the yield of an integrated circuit device according to claim 8, wherein said chip area is corrected so as to increase the chip area with an increase in element density corresponding to the element density in each integrated circuit device.

* * * * *